(12) United States Patent
Shan (10) Patent No.: US 10,148,142 B1
(45) Date of Patent: Dec. 4, 2018

(54) BUCKLING LOOP ROTARY MOTOR (71) Applicant: Baoxiang Shan, Hoboken, NJ (US)

(72) Inventor: Baoxiang Shan, Hoboken, NJ (US)

( * ) Notice: Subject to any disclaimer, the term of this patent is extended or adjusted under 35 U.S.C. 154(b) by 0 days.

(21) Appl. No.: 15/897,334

(22) Filed: Feb. 15, 2018

Related U.S. Application Data (60) Provisional application No. 62/506,199, filed on May 15, 2017, provisional application No. 62/506,828, filed on May 16, 2017, provisional application No. 62/507,300, filed on May 17, 2017, provisional application No. 62/509,102, filed on May 20, 2017, provisional application No. 62/597,147, filed on Dec. 11, 2017.

(51) Int. Cl.
*H02N 10/00* (2006.01)
*H02K 1/22* (2006.01)
*H02K 1/12* (2006.01)
*H01L 41/193* (2006.01)
*H01L 41/047* (2006.01)
*H02K 11/00* (2016.01)
*H02K 9/00* (2006.01)

(52) U.S. Cl.
CPC .............. *H02K 1/22* (2013.01); *H01L 41/047* (2013.01); *H01L 41/193* (2013.01); *H02K 1/12* (2013.01); *H02K 9/00* (2013.01); *H02K 11/0094* (2013.01); *H02N 10/00* (2013.01)

(58) Field of Classification Search
CPC ... H01L 41/047; H01L 41/0478; H02N 2/001; H02N 2/0035; H02N 10/00
USPC ......................................... 310/300, 307, 309
See application file for complete search history.

(56) References Cited

U.S. PATENT DOCUMENTS

| 2,836,785 | A | * | 5/1958 | Neubert | H02N 1/00 310/309 |
|---|---|---|---|---|---|
| 3,414,742 | A | * | 12/1968 | Fisher | H02N 1/004 310/308 |
| 6,161,382 | A | * | 12/2000 | Brotz | F03G 7/06 310/307 |
| 6,327,909 | B1 | | 12/2001 | Hung | |
| 6,392,331 | B1 | | 5/2002 | Sciacca | |
| 8,584,456 | B1 | | 11/2013 | McKnight | |
| 9,744,563 | B2 | | 8/2017 | Benjamin | |
| 2013/0082427 | A1 | | 4/2013 | Zavattieri | |

\* cited by examiner

*Primary Examiner* — Thomas Truong
(74) *Attorney, Agent, or Firm* — r.r (princeton); Roy Rosser (57) ABSTRACT

A buckling loop rotary motor is disclosed that has a stator, an activatable buckling loop and a rotor. The buckling loop is made of a springy, base band and an activatable active band. An applied force actuates a portion of loop, causing a localized change of curvature. When propagated along the buckling loop, the changed curvature causes rotation of the rotor. In a bi-metallic embodiment, the thermally actuated active band expands by at least 1% more than the base band, effect a localized change of curvature that drives the rotor. Thermal activation is by heating or cooling, or a combination thereof. In an electroactive polymer (EAP), the active acrylic or silicone EAP is actuated by an electrostatic charge. The change in thickness, and therefore, length, of the active EAP relative to the inactive, base material causes a local change of curvature of the loop that drives rotation of the rotor.

22 Claims, 6 Drawing Sheets

BUCKLING LOOP ROTARY MOTOR

CROSS-REFERENCE TO RELATED APPLICATIONS

This application claims priority to U.S. Ser. No. 62/506,199 entitled "Looped Multistable System" filed on May 15, 2017 by Baoxiang Shan; to U.S. Ser. No. 62/506,828 entitled "Flexible Actuator and Sensor" filed on May 16, 2017 by Baoxiang Shan; to U.S. Ser. No. 62/507,300 entitled "Flexible Movement System" filed on May 17, 2017 by Baoxiang Shan; to U.S. Ser. No. 62/509,102 entitled "Travelling Wave Pumps" filed on Dec. 11, 2017 by Baoxiang Shan, and to U.S. Ser. No. 62/597,147 entitled "Joined-Band Devices Configured for Motion" filed on Dec. 11, 2017 by Baoxiang Shan, the contents of all of which are hereby fully incorporated herein by reference.

BACKGROUND OF THE INVENTION

(1) Field of the Invention

The invention relates to a motor for producing rotary motion using actuation of a flexible band constrained to form a buckled loop, and more particularly, to a buckling loop rotary motor in which actuation of the buckled loop may be by a change of curvature of a portion of the loop through expansion or contraction of a localized portion of the loop. The loop may have an active and a base material, and may be bi-metallic, or have active materials that may be a shape memory alloy (SMA), a bi-morph piezoelectric polymer (PVDF), an electroactive polymer (EAP), a piezoelectric material, an electro-restrictive material or a magneto-restrictive material, or a combination thereof.

(2) Description of the Related Art

The technical problem of creating rotary motion is inherent in the technical field of mechanical engineering, as rotary motion may be used, for instance, to transport objects or to activate mechanisms, such as, but not limited to, mechanical control valves.

Rotary motion that may be driven directly, or indirectly, by means of an electric current, or voltage, is particularly desirable for actuating mechanisms, as this facilitates the integration of the mechanical device with electronic control systems.

A problem with existing electric motors that often arises when they are used to actuate mechanisms such as, but not limited to, control valves, is that existing electronic motors typically operate at rotational speeds that require reduction gearing to match their speed of rotation to that required to most effectively manipulate the valve. Gear mechanisms not only add to the cost and complexity of such systems, but also tend to be the part of the device most prone to failure in harsh or adverse environments, including, but not limited to, extremes of acceleration.

It is, therefore, highly desirable to have a gearless, electrically-driven, rotary motor capable of producing the speeds and torques suitable for actuating mechanical mechanisms such as, but not limited to, control valves. It is also desirable that such gearless motors are compact, and simple to construct.

The relevant existing art includes:

A paper published in The Proceedings of the Royal Society A: Mathematical, Physical and Engineering Sciences, on Aug. 16, 2017 by Hamouche et al. entitled "Multi-parameter actuation of a neutrally stable shell: a flexible gear-less motor" that describes the design and experimental testing of a morphing structure consisting of a neutrally stable thin cylindrical shell driven by a multi-parameter piezoelectric actuation. The shell is obtained by plastically deforming an initially flat copper disc, so as to induce large isotropic and almost uniform inelastic curvatures. Following the plastic deformation, in a perfectly isotropic system, the shell is theoretically neutrally stable, having a continuous set of stable cylindrical shapes corresponding to the rotation of the axis of maximal curvature. Small imperfections render the actual structure bistable, giving preferred orientations. A three-parameter piezoelectric actuation, exerted through micro-fiber-composite actuators, allows the addition of a small perturbation to the plastic inelastic curvature and to control the direction of maximal curvature. The authors report on the fabrication and experimental testing of a prototype and demonstrate the effectiveness of the piezoelectric actuators in controlling its shape. The resulting motion is an apparent rotation of the shell, controlled by the voltages as in a 'gear-less motor', which is, in reality, a precession of the axis of principal curvature.

Various implementations are known in the art, but fail to address all of the problems solved by the invention described herein. Various embodiments of this invention are illustrated in the accompanying drawings and will be described in more detail herein below.

BRIEF SUMMARY OF THE INVENTION

An inventive buckling loop rotary motor is disclosed.

In a preferred embodiment, buckling loop rotary motor may include a rigid stator, an activatable buckling loop and a rotor. The stator may, for instance, have a cylindrical, inner surface with a circular cross-section. The buckling loop may, for instance, be made of a combination of a suitably springy, base band and an active band. This buckling loop may be constrained within the cylindrical, inner surface of the rigid stator to form one or more buckles. The rotor may be sized and shaped to conform, in part, to an inner surface of the buckling loop.

The rotary motor may be driven by a stimulus, or force, that may actuate a portion of the activatable, buckling loop. This actuation may result in a localized change of curvature of the buckling loop. This localized change of curvature may propagate along the buckling loop, causing rotation of the rotor with respect to the stator. The direction of rotation may be selected by which portions of the buckling loop are activated, and the axis of rotation is preferably located coaxially with the central axis of cylindrical, inner surface of the stator.

The buckling loop is preferably a continuous ribbon of a uniform thickness and a uniform width and having no end point, with the width being greater than the thickness. The material composition of the buckling loop may, for instance, depend on the method of actuation.

In a preferred embodiment, the buckling loop may have a base band and an active band, with the active band being made of a first, active material and the base band made of a second, base material. The materials may be selected such that, in response to an actuating force, or stimulus, a portion of the first, active material expands in length more than the second, base band material, preferably by at least 0.1%, but in more preferred embodiments by at least 1%. Because the bands are joined together, the resulting stress may effect a localized change of curvature of the activated portion of the buckling loop. The energy of this buckling may then be transformed into rotation of the rotor as the buckled loop changes shape and attempts to minimize its overall stress.

In one preferred embodiment of the present invention, the buckling loop may be a bi-metallic loop, with the active band material having a higher coefficient of linear thermal expansion than the base band material. Such a bi-metallic buckling loop may be actuated by a localized, electrically-controlled, heating element such as, but not limited to, an electrical resistor, an electrical diode, or a light emitting diode (LED), or some combination thereof.

Suitable materials for the active band of a bi-metallic buckling loop include, but are not limited to, Titanium alloys, stainless steel alloys, copper alloys, aluminum alloy, and combinations thereof.

In such a bi-metallic, buckling loop rotary motor, it may be most energy efficient to activate a buckle at an inflection point of the buckle. In such a device, the heating elements may, therefore, be fixed on the rotor adjacent to inflection points of one or more of the buckles formed in the buckling loop.

In a further preferred bi-metallic, embodiment of the invention, the actuation of a portion of the buckling loop may be provided by a cooling element such as, but not limited to, a Peltier cooling device.

As cooling and heating a buckling loop at the same inflection point may impel the rotor in opposite directions, a heating and a cooling element may be used in conjunction, with, for instance, heating being applied to an inflection point on one side of a buckle while cooling is applied at the corresponding inflection point on the opposite side of the same buckle. Peltier devices may be driven to provide either cooling or heating, so having Peltier devices as the actuating elements may allow for rotor motor that may be driven in opposite rotational directions by changing whether they are driven to heat or to cool.

In a further preferred embodiment of the invention, the buckling loop may be an electroactive polymer (EAP) activated buckling loop rotary motor. In such a motor, the active material may an EAP such as, but not limited to, an acrylic or a silicone EAP, that act as deformable capacitors, changing their thickness in response to an applied electric field. Such materials typically have elastic energy densities well above the 0.02 $J/cm^3$ to 0.13 $J/cm^3$ range of more conventional piezoelectric ceramic materials. An EAP buckling loop, may, for instance, have an EAP active layer and a suitably springy metal base layer, including metals typically used to make springs such as, but not limited to, Titanium alloys, stainless steel alloys, copper alloys, aluminum alloy, and combinations thereof. A portion of an EAP buckling loop may, for instance, be actuated by an electrostatic voltage supplied by suitably located electrical contacts. The activated localized portion of the EAP buckling loop, in which the activated EAP material changes shape while the underlying base loop material does not, may result in localized stresses that may cause a local change of curvature of the loop that, when propagated along the loop, may result in rotational motion of the rotor.

In an alternate embodiment, the rotor may have rollers that may contact the buckling loop at the apex point of a buckle, helping maintain the shape of the buckle. Such rollers may also serve as electrical contacts to activate electroactive materials such as, but not limited to, electroactive polymers. Activation of the electroactive material at an inflection point of a buckle by contact point at the apex of the buckle may, for instance, be accomplished using staggered wiring array on the buckling loop, as described in detail below.

Other materials that may be used as active materials in the active loop of a buckling loop rotary motor include, but are not limited to, electorestrictive materials, magnetorestrictive materials, piezoelectric materials, and shape memory alloys, or some combination thereof.

Therefore, the present invention succeeds in conferring the following, and others not mentioned, desirable and useful benefits and objectives.

It is an object of the present invention to provide a compact, lightweight rotary motor.

It is a further objective of the present invention to provide a gearless, electrically controlled rotary motor suitable for actuating mechanical mechanisms.

DETAILED DESCRIPTION OF THE INVENTION

The preferred embodiments of the present invention will now be described in more detail with reference to the drawings in which identical elements in the various figures are, as far as possible, identified with the same reference numerals. These embodiments are provided by way of explanation of the present invention, which is not, however, intended to be limited thereto. Those of ordinary skill in the art may appreciate upon reading the present specification and viewing the present drawings that various modifications and variations may be made thereto without departing from the spirit of the invention.

Figure 1A:
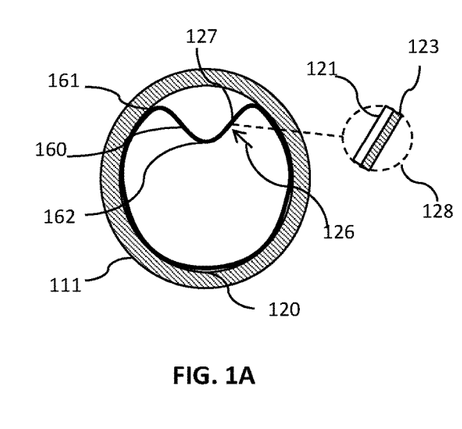
FIG. 1A shows a schematic, cross-sectional side view of a single-buckle, buckling loop constrained within a rigid cylinder, and a close-up view of an activatable region of the loop prior to activation.

FIG. 1A shows a schematic, cross-sectional side view of a single-buckle, buckling loop 120 constrained within a rigid cylinder 111, and a close-up view 128 of an activatable region of the loop prior to activation.

As shown, the buckling loop 120 may have two regions of buckle/restraint contact 161 and a buckle apex 162, at each of which the loop may have a positive or negative curvature greater in magnitude than the curvature of the loop where it is merely constrained by the rigid cylinder 111. The single buckle buckling loop 120 may also have two inflection points 160 at which the curvature of the loop is zero.

A portion 127 of the buckling loop 120 may be activated by an actuating force 126. The nature of the actuating force 126 may depend on the composition of the buckling loop 120. This situation may be seen in more detail in a close up of activated portion prior to activation 128. In this view, the portion to be activated is at an inflection point of a buckle, and the loop may be made up of an active band 121 made, at least in part, of a first, active material and a base band 123 made, at least in part, of a second, base material. If, as shown in FIG. 1A, the actuating force 126 is applied at a point of inflection, the activated portion 127 of the loop will have zero curvature prior to application of the actuating force 126.

Figure 1B:
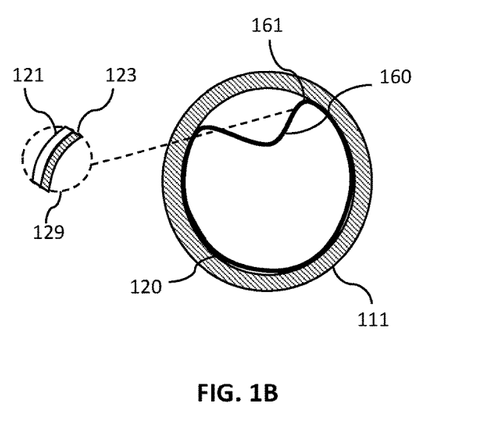
FIG. 1B shows a schematic, cross-sectional side view of a single-buckle, buckling loop constrained within a rigid cylinder, and a close-up view of an activatable region of the loop after activation.

FIG. 1B shows a schematic, cross-sectional side view of the single-buckle, buckling loop 120 constrained within the rigid cylinder 111 after application of the actuating force, and a close-up view 129 of the activated region of the loop after activation.

As seen in FIG. 1B, the activated portion of the loop now has a curvature as a result of the active band 121 having expanded laterally more than the underlying base band 123 to which it may be attached. The more curved, activated portion of the loop may then effectively migrate to a region of the loop where the curvature imparted to the activated portion more closely matches the curvature of the buckle, such as the buckle loop/restraining rigid cylinder contact region 161. In doing so, the loop may be moved rotationally.

The examples below show how the nature of the actuating force may depend on the material composition of the active band and the base band. The direction of rotation of the buckled loop may also be shown to depend on the material choice and the nature of the actuating force.

Figure 2:
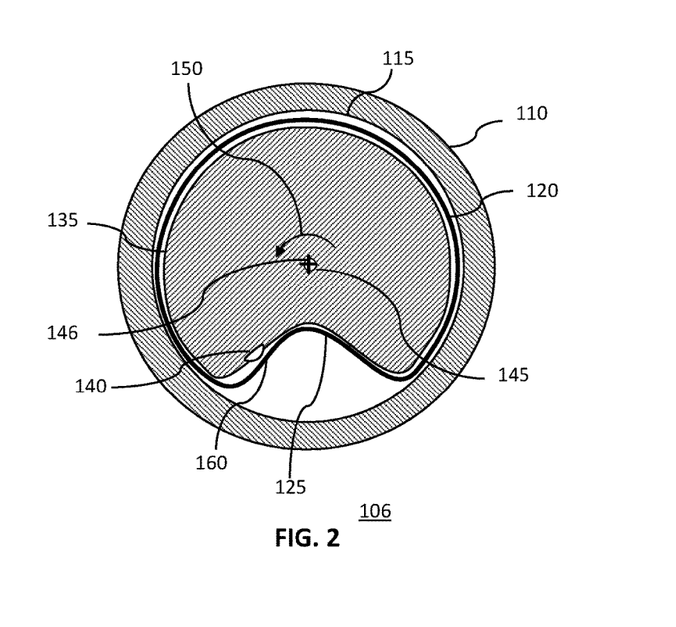
FIG. 2 shows a schematic, cross-sectional side view of a single-buckle, buckling loop rotary motor of one embodiment of the present invention.

FIG. 2 shows a schematic, cross-sectional side view of a single-buckle, buckling loop rotary motor of one embodiment of the present invention.

The single-buckle, buckling loop rotary motor 106 shown in FIG. 1 may include a rigid stator 110, a rotor 135 and a buckling loop 120.

In a preferred embodiment, the rigid stator 110 may have a cylindrical, inner surface 115 having a circular cross-section with a central axis 146.

The buckling loop 120 may be constrained within the cylindrical, inner surface 115 of the rigid stator 110 such that the buckle 125 may be formed in the loop. The buckling loop 120 is preferably constructed as continuous ribbon of a uniform thickness, having a uniform width and having no end point. The width of the buckling loop 120 may be greater than its thickness, typically by a factor of at least two, and more preferably by at least a factor of five. Part of the reason for having a greater width to thickness ratio may be to minimize the out-of-plane bending, or buckling, of the loop.

The rotor 135 may be shaped and sized to conform, in part, to the inner surface of the buckling loop 120 when constrained, and buckled, within the cylindrical, inner surface 115 of the rigid stator 110.

In a bi-metallic embodiment of the single-buckle, buckling loop rotary motor 106, the buckling loop 120 may be made of an active band that may have a first, active material that may have a higher coefficient of thermal expansion than that of the base material of which the base band may be made. In such a bi-metallic embodiment, there may be actuator elements 140 that may be either heating or cooling elements.

It is preferable in such a bi-metallic embodiment that, in response to an actuating force, an activated portion of the first, active material expands in length by at least 1% more than the second material, thereby effecting a local change of curvature of the actuated portion of the buckling loop.

The active band may, for instance, be make of materials having a coefficient of linear, thermal expansion greater than $5 \times 10^{-6}$ m/m/° C. such as, but not limited to, fabric reinforced silicone, fabric reinforced polyurethane, Titanium alloys, stainless steel alloys, copper alloys and aluminum alloys, or combinations thereof. Particularly suitable materials may include Titanium alloys such as, but not limited to, so called Beta titanium alloys, i.e., titanium alloyed in varying amounts with one or more of molybdenum, vanadium, niobium, tantalum, zirconium, manganese, iron, chromium, cobalt, nickel, and copper. This type of alloy may have a strength/modulus of elasticity ratios almost twice that of 18-8 austenitic stainless steel, allowing for larger elastic deflections in springs, and a reduced force per unit displacement. Suitable alloys may include, but are not limited to, "BETA III" (Ti-11.5 Mo-6.5 Zr-4.6 Sn), Transage 129 (Ti-2Al-11.5V-2Sn-11.3Zr) or Ti-6Al-4V, or some combination thereof.

The base material in such a bi-metallic rotary motor may be any material with a coefficient of linear, thermal expansion that is significantly less than that of the active material. Suitable base materials for a bi-metallic buckling loop include nickel-iron alloys such as, but are not limited to, Invar, NILO alloy 42, Kovar, and Dilver P, or some combination thereof.

When the buckling loop 120 is bi-metallic, with the active and base materials having a difference in linear thermal coefficients of expansion, the actuator elements may be heating elements. An actuator element 140 that is a heating element may, for instance, be attached to the rotor 135 and located such that the heat it supplies stresses the buckle 125 of the buckling loop 120, creating a localized region of curvature, that, as it is propagated, impels the rotor 135 is impelled to rotate in a first direction of rotation 150 about its axis of rotation 145 located coaxially with a central axis 146 of said cylindrical, inner surface 115.

Suitable electrically controlled heating actuator elements 140 include, but are not limited, to, elements made of materials having high electrical resistance and a high melting point, such as, but not limited to, tungsten, nichrome, Kanthal™ FeCrAl alloys, cupronickel, molybdenum disilicide, or devices that emit heat such as, but not limited to, resistors, diodes and light-emitting diodes (LEDs), or some combination thereof.

For optimal use of the heat generated by such heating actuator elements 140, they are preferably placed at, or near, an inflection point 160 of a buckle 125, as that is where the change in curvature they effect may have greatest effect on the rotational torque of the motor.

In a further embodiment of the invention, in a single-buckle, buckling loop rotary motor 106 with a bi-metallic buckling loop 120 having a difference of coefficient of thermal expansions of active and base materials, the actuator elements 140 may be cooling elements. Such cooling elements may, for instance, be a suitable thermoelectric cooling elements such as, but not limited to, well-known Peltier cooling semiconductor devices.

As cooling at an inflection point of a buckle 125 may impel a single-buckle, bi-metallic, buckling loop rotary motor 106 to rotate in an opposite direction to that it would if that inflection point had been heated, a heating element and a cooling element may be used with one placed at each of the corresponding inflection points of the same buckle. The combination of the heating and the cooling elements on a single bi-metallic buckle may increase the torque that may be applied by the motor.

Furthermore, as a Peltier device may heat or cool, depending on the direction of the flow, if the actuator elements 140 are Peltier devices, they may be used to drive a motor in a first direction of rotation, or in an opposite direction of rotation, depending on which direction the current through them flows. Having actuator elements 140 that are Peltier activated devices may, therefore, allow for gearless, reversible single-buckle, bi-metallic buckling loop rotary motors.

Figure 3:
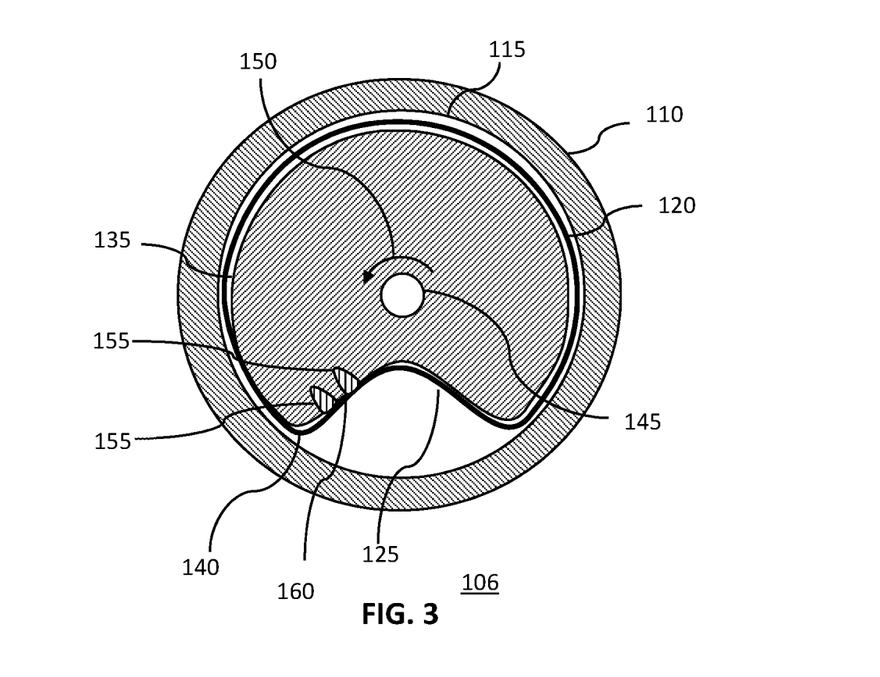
FIG. 3 shows a schematic, cross-sectional side view of a single-buckle, buckling loop rotary motor of a further embodiment of the present invention.

FIG. 3 shows a schematic, cross-sectional side view of a single-buckle, buckling loop rotary motor of a further embodiment of the present invention.

The single-buckle, buckling loop rotary motor 106 shown in FIG. 3 may include a rigid stator 110 with a cylindrical, inner surface 115 having a circular cross-section in which a buckling loop 120 may be constrained to form a buckles 125, and a rotor 135, shaped and sized to fit, in part the inner contour of the constrained buckling loop. However, in the embodiment depicted in FIG. 3, the buckling loop 120 may have a first, active material that is an electroactive polymer (EAP) and in which the actuating force is supplied by an electrostatic charge. The electrostatic charge may, for instance, be supplied by one or more electrical contacts 155.

The electroactive polymer (EAP) preferably has a dielectric constant of at least 2, measured at room temperature, i.e., at 293 K (20° C. or 68° F.), and 1 KHz. Note: for scientific calculations using the absolute temperature scale, room temperature may sometimes be taken as 300 K to simplify the calculation. The first, active material may also/or instead, be selected to have an energy density greater than or equal to $0.02$ J/cm$^3$, and more preferably to have an energy density greater than or equal to $0.4$ J/cm$^3$.

Particularly suitable electroactive polymers for use in rotary motors include, but are not limited to, an acrylic or a silicone, or a combination thereof. One example of a commercially available electroactive polymer (EAP) suitable for use in a buckling loop rotary motor is 3M VHB (Very High Bonding) tape supplied by the 3M Company, Maplewood, Minn.

In the EAP buckling loop 120, the base material is preferably a suitably springy material such as, but not limited to, a fabric reinforced silicone, a fabric reinforced polyurethane, a Titanium alloy, a stainless steel alloy, a copper alloy or an aluminum alloy, or a combination thereof. Further embodiments may use a base material that may be a highly elastic material. A highly elastic metal may, for instance, have a yield strain greater than 0.1% and more preferably, a yield strain greater than 1%.

In a preferred embodiment of such an electroactive, single-buckle, buckling loop rotary motor 106, there may also be one or more electrical contacts 155 that may be located on the rotor 135 such that they may supply the necessary electrical voltage and current to a region of the buckling loop 120 in a vicinity of one of the inflection points 160 of the buckles 125. This voltage may then cause that region of the buckling loop 120 to develop a stress resulting in imparting a localized curvature to the loop that may impel the rotor 135 to rotate in a first direction of rotation 150 about the axis of rotation 145.

In yet further embodiments of the invention, the active band of the buckling loop 120 may, for instance, be made wholly, or in part, of an active material that is an electroactive material such as, but not limited to, a polyvinylidene fluoride (PVDF) or an Iodine doped polyacetylene, or a combination thereof.

In an alternate embodiment of the invention, the active band of the buckling loop 120 may instead be made wholly, or in part, of an active material that may be magnetostrictive and may have a magnetostrictive coefficient greater than 50 microstrains. Regions of such a buckling loop 120 may be activated by suitable magnetic sources that may, for instance, be placed on the rotor 135 so as to activate one of the inflection points 160 of the buckle 125.

A suitable magnetorestictive material having a magnetostrictive coefficient greater than 50 microstrains may be a material such as, but not limited to, Terfenol-D, or Galfenol. Terfenol-D stands for Ter for terbium, Fe for iron, NOL for Naval Ordnance Laboratory, and D for dysprosium. It is a material that may exhibits about 2,000 microstrains in a field of 2 kOe (160 kA/m) at room temperature. A suitable source of magnetic flux may be a magnet such as, but not limited to, a suitably strong rare-earth permanent magnet, or an electro-magnet or a combination thereof.

The source of magnetic flux may cause a region of the buckling loop 120 to impart a localized stress to the loop that may cause localized bending of the loop and so impel the rotor 135 to rotate in a first direction of rotation 150 about the axis of rotation 145.

Figure 4:
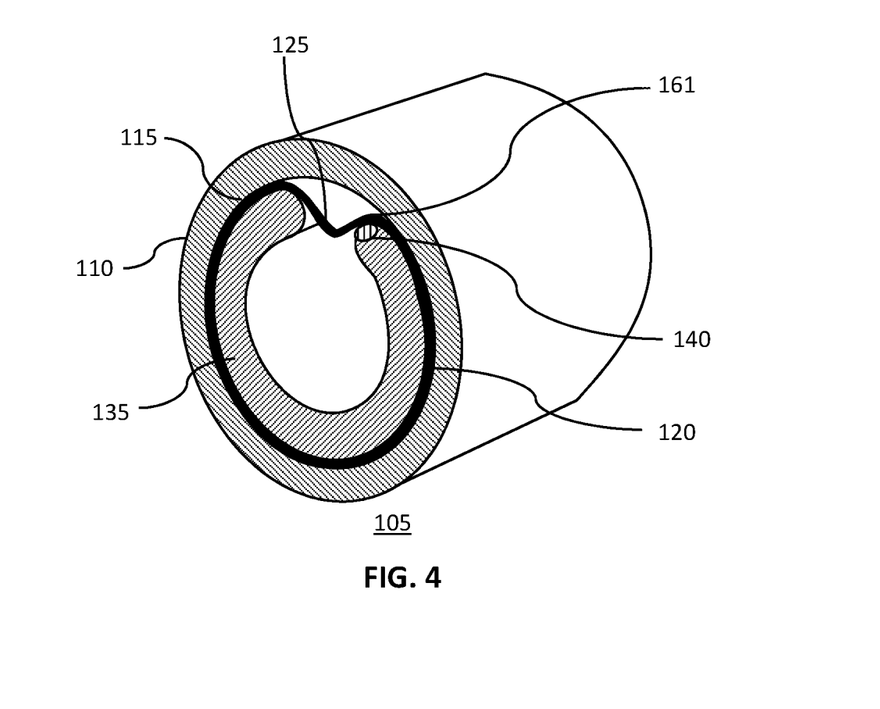
FIG. 4 shows an isometric, cut-away view of a single-buckle buckling loop rotary motor of one embodiment of the present invention.

FIG. 4 shows an isometric, cut-away view of a single-buckle buckling loop rotary motor of one embodiment of the present invention.

The inventive device depicted in FIG. 4 includes a rigid stator 110 having a cylindrical, inner surface 115 having a circular cross-section. A buckling loop 120 is shown constrained by that cylindrical, inner surface 115 to form a buckle 125 that may be actuated by an actuating force supplied via an actuator element 140 situated on a rotor 135.

In the embodiment of FIG. 4, the buckling loop 120 may, for instance, a single layer loop having an active material such as, but not limited to, a two-way shape memory active material 132. Such a material effectively remembers two different shapes—one that it assumes at a higher temperature and one that it assumes at a lower temperature. Materials that exhibit a two-way shape memory include, but are not limited to, nickel/titanium alloys, such as Nitinol.

The two-way shape memory active material may, for instance, be actuated by one or more actuator elements 140 that may be heating or cooling elements, or a combination thereof.

The two-way shape memory active material may, for instance, have a greater curvature at a lower temperature and a lesser curvature at a higher temperature, i.e., it may be bent when cold and straight when hot. For such a material, a most advantageous location for an actuator element 140 that is a heating element may be at, or close to, a region of buckle/restraint contact 161.

Suitable heating elements include, but are not limited to, electrically heated elements such as, but not limited to, resistance wire, resistors, diodes, or light emitting diodes, or some combination thereof.

Suitable cooling elements include, but are not limited to, Peltier devices, which may also, or instead, act as heating elements.

Figure 5:
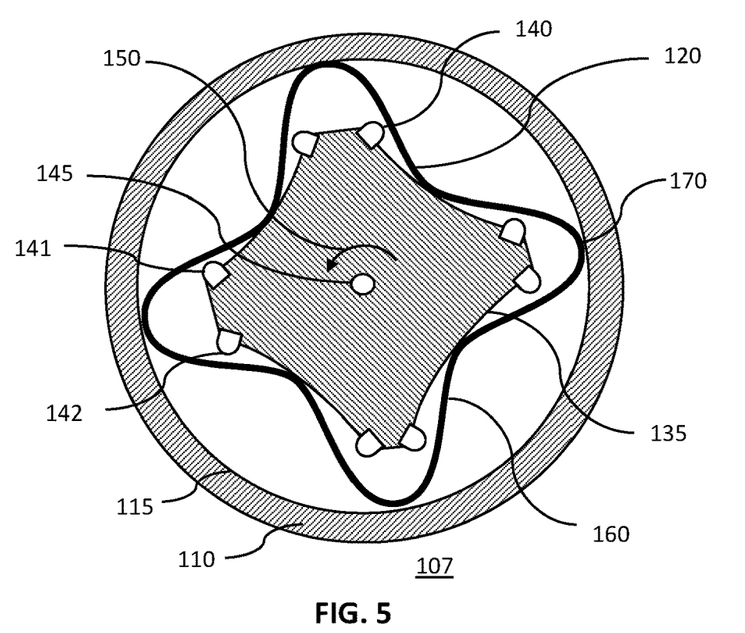
FIG. 5 shows a schematic, cross-sectional, side view of a multi-buckle, buckling loop rotary motor of one embodiment of the present invention.

FIG. 5 shows a schematic, cross-sectional, side view of a multi-buckle, buckling loop rotary motor of one embodiment of the present invention.

The multi-buckle, buckling loop rotary motor 107 may have a rigid stator 110 with a cylindrical, inner surface 115 having a circular cross-section, and a rotor 135. Located between the rotor 135 and the cylindrical, inner surface 115 may be a buckling loop 120 constrained to form a multiplicity of buckles 125. In the embodiment of FIG. 5, there the buckling loop 120 is shown constrained to form four buckles 125.

In a bi-metallic embodiment of the multi-buckle, buckling loop rotary motor 107, the buckling loop 120 may be made of an active band that may have an active material that may have a higher coefficient of thermal expansion than that of the base material of which the base band may be made. In such a bi-metallic embodiment, there may be actuator elements 140 that may be either heating or cooling elements.

The bi-metallic buckling loop 120 may, for instance, be made with an active material that may have a coefficient of linear, thermal expansion greater than $5 \times 10^{-6}$ m/m/° C. Such materials include, but are not limited to, fabric reinforced silicones, fabric reinforced polyurethanes, Titanium alloys, stainless steel alloys, copper alloys, aluminum alloy, and combinations thereof. Particularly suitable active materials may include Titanium alloys such as, but not limited to, so called Beta titanium alloys, i.e., titanium alloyed in varying amounts with one or more of molybdenum, vanadium, niobium, tantalum, zirconium, manganese, iron, chromium, cobalt, nickel, and copper. This type of alloy may have a strength/modulus of elasticity ratios almost twice that of 18-8 austenitic stainless steel, allowing for larger elastic deflections in springs, and a reduced force per unit displacement. Suitable alloys may include, but are not limited to, "BETA III" (Ti-11.5 Mo-6.5 Zr-4.6 Sn), Transage 129 (Ti-2Al-11.5V-2Sn-11.3Zr) or Ti-6Al-4V, or some combination thereof.

In such a thermally activated, bi-metallic embodiment of the buckling loop rotary motor, there may either heating or cooling elements 140, that may be used to activate localized regions of the loop. These actuating, heating or cooling, elements are each preferably located on the rotor 135 opposite one of the two inflection points 160 of one of the buckles 125.

A heating element 141 placed on the rotor 135 opposite a first inflection point of a buckles 125 may, when heated, induce a stress in the buckling loop 120 that may cause a localized change of curvature of the loop and so impel the rotor 135 to turn in a first direction of rotation 150 about an axis of rotation 145 of the rotor.

Similarly, cooling element 142 placed on the rotor 135 opposite a second, adjacent inflection point of that same buckles 125, may, when cooled, induce a stress in the buckling loop 120 that may cause a localized change of curvature of the loop and so impel the rotor 135 to turn in the same, first direction of rotation 150 about the axis of rotation 145 of the rotor.

In this way, pairs of heating elements 141 and cooling elements 142 may be used together to significantly increase the stresses applied to the buckling loop 120 and therefore increase the torque of the buckling loop rotary motor.

If the positions of the heating element 141 and the cooling elements 142 are switched, the rotor 135 may then be impelled to turn in an opposite direction to the first direction of rotation 150, thereby facilitating a reversible, but gearless, motor. As Peltier devices may be either heating or cooling devices, depending on the direction of the electrical current flowing through them, switching an actuator element 140 may be accomplished electronically by switching the direction of current flow through them.

Figure 6:
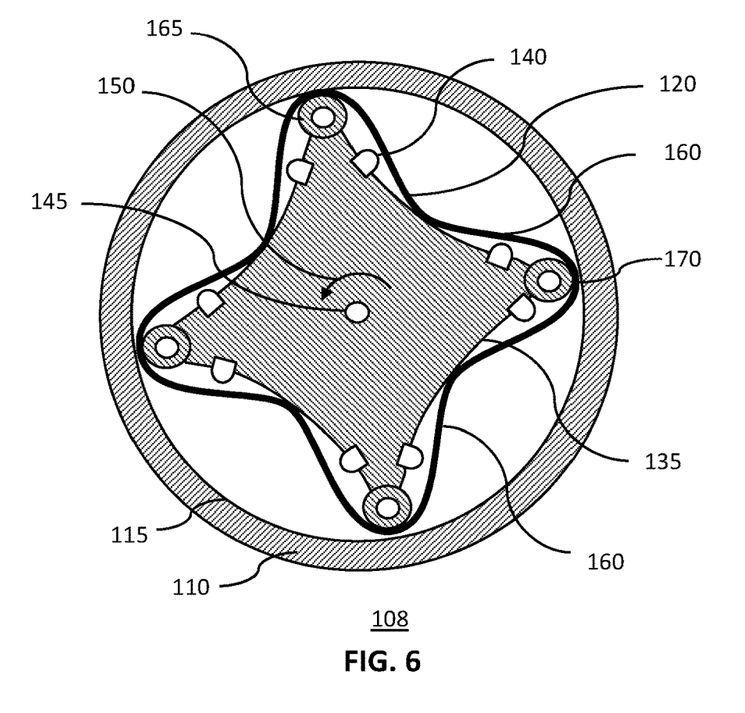
FIG. 6 shows a schematic, cross-sectional, side view of a multi-buckle, roller stabilized, buckling loop rotary motor of one embodiment of the present invention.

FIG. 6 shows a schematic, cross-sectional, side view of a multi-buckle, roller stabilized, buckling loop rotary motor of one embodiment of the present invention.

In the multi-buckle, roller stabilized, buckling loop rotary motor 108 depicted in FIG. 6, in addition to the rigid stator 110 with a cylindrical, inner surface 115 having a circular cross-section, the buckling loop 120 constrained within the cylindrical, inner surface 115, and the rotor 135 contained within the buckling loop 120, there are one or more rollers 165. The rollers 165 may be rotatably attached to the rotor 135 and may serve to assist in constraining the buckling loop 120 to form the required buckles 125, by, for instance, being situated to contact the buckling loop at an inner surface of an apex 170 of one or more of said buckles.

In a bi-metallic embodiment, the buckling loop 120 may have an active material having c a material having a coefficient of linear, thermal expansion greater than the base material, as described in more detail above regarding other embodiments of thermally activated, bi-metallic buckling loop rotary motors.

Similarly, the actuator elements 140 supplying the actuating force to the thermally activated bi-metallic loop may be either heating or cooling elements. These are each preferably located on the rotor 135 opposite one of the two inflection points 160 of one of the buckles 125, as described in more detail above, regarding other embodiments of thermally activated buckling loop rotary motors.

Figure 7:
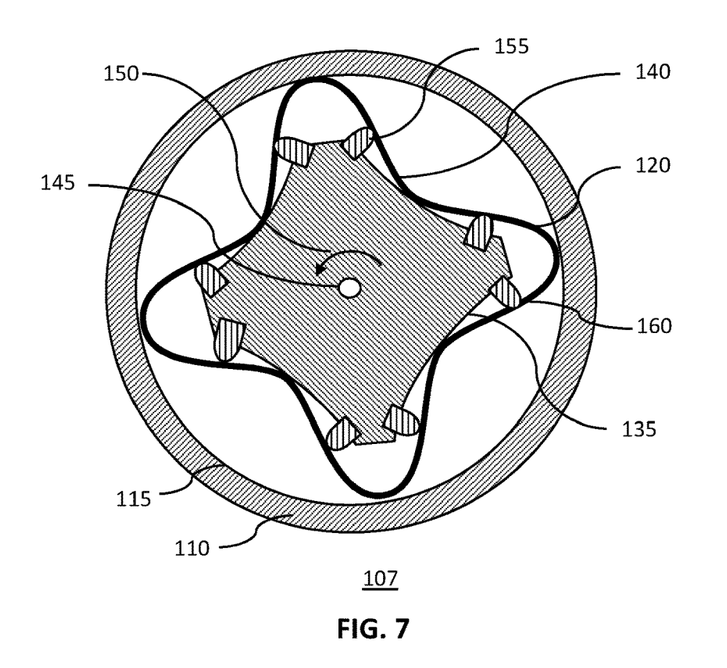
FIG. 7 shows a schematic, cross-sectional, side view of a multi-buckle, buckling loop rotary motor of another embodiment of the present invention.

FIG. 7 shows a schematic, cross-sectional, side view of a multi-buckle, buckling loop rotary motor of another embodiment of the present invention, in which a buckling loop 120 is constrained within the cylindrical, inner surface 115 having a circular cross-section of a rigid stator 110 and encompasses a rotor 135.

The multi-buckle, buckling loop rotary motor 107 depicted in FIG. 7 may have an electroactive buckling loop 120 made of an active material that is an electroactive polymer (EAP) and in which the actuating force is supplied by an electrostatic charge. The electrostatic charge may, for instance, be supplied by one or more electrical contacts 155 that may be a part of the rotor 135. As with other electroactive embodiments described above, the actuator elements 140 are preferable turned on when they are at an inflection point of a buckle, so that the stress induced in the buckling loop 120 may be more effective in impelling the rotor 135 to rotate in a first direction of rotation 150 about the axis of rotation 145 of the rotor.

The first, active material of such an electroactive buckling loop may, for instance, be selected to one having an energy density greater than or equal to 0.02 $J/cm^3$, and more preferably to one having an energy density greater than or equal to 0.4 $J/cm^3$.

Figure 8:
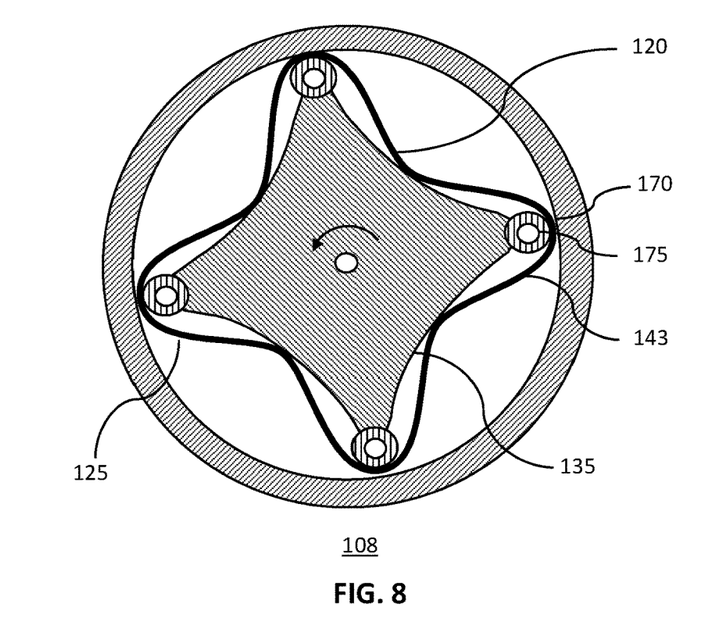
FIG. 8 shows a schematic, cross-sectional, side view of a multi-buckle, roller stabilized, buckling loop rotary motor of further embodiment of the present invention.

FIG. 8 shows a schematic, cross-sectional, side view of a multi-buckle, roller stabilized, buckling loop rotary motor of further embodiment of the present invention.

In the electro-active embodiment of a multi-buckle, roller stabilized, buckling loop rotary motor 108 depicted in FIG. 8, the rollers may now be electrical contact roller 175 and be the means by which the appropriate electrical current and/or voltages are supplied to the actuate the appropriate regions of the buckling loop 120.

In order for a contact made by the electrical contact roller 175 at an apex 170 of a buckle 125 to actuate an activatable region 143 at an inflection point, a staggered wiring array may need to be printed, or otherwise associated with the buckling loop 120. One embodiment of such a staggered wiring array is depicted in FIG. 9.

Figure 9:
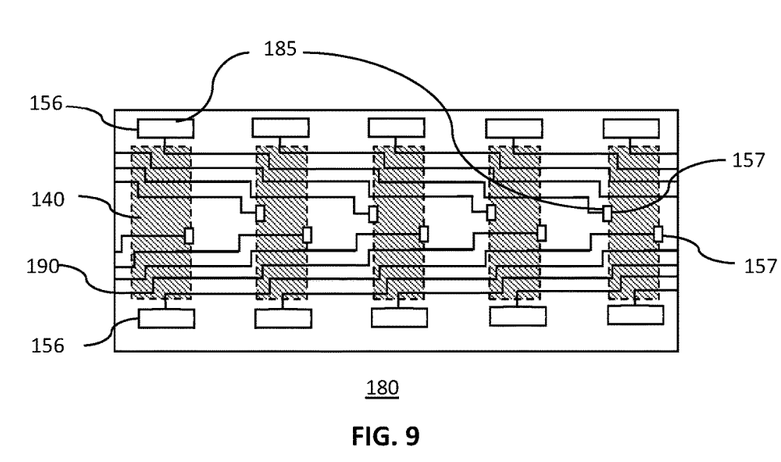
FIG. 9 shows a schematic, top view of a section of a staggered wiring array of one embodiment of the present invention.

FIG. 9 shows a schematic, top view of a section of a staggered wiring array of one embodiment of the present invention.

The staggered wiring array 180 may, for instance, have actuator elements 140 arranged on one surface of a buckling loop, and supply electrical contacts 156 arranged on the other surface. The supply electrical contacts 156 may be joined to actuator electrical contacts 157 via appropriate electrical contact paths 190, and the actuator electrical contact 157 may extend through the depth of the buckling loop, so that wiring on one surface of the loop may then be extended through to contact the actuator elements 140 that may be situated on the other surface of the loop. By suitable arrangement of the wiring, corresponding 185 supply contacts and actuator contacts may allow an electrical voltage applied to the contact at an apex of a buckle to activate an actuator element 140 located at an inflection point of that buckle.

Figure 10:
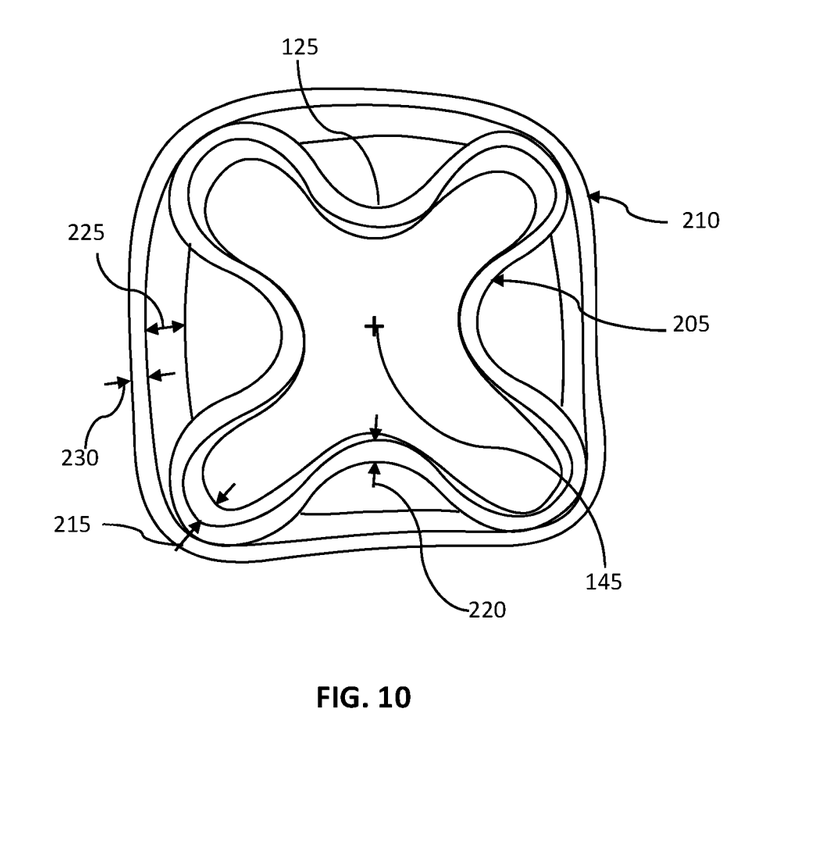
FIG. 10 shows a schematic, 3D view of one embodiment of the present invention having a flexible external constraint membrane.

FIG. 10 shows a schematic, 3D view of one embodiment of the present invention having a flexible external constraint membrane.

As shown in FIG. 10, a compliant band, or ribbon 205, of longer circumference may be externally constrained by another compliant band, or ribbon 210, of shorter circumference. As seen in FIG. 10, with due allowance for perspective, the width 215 of the longer ribbon 205 may be greater than the thickness 220 of the longer ribbon 205. Similarly, with the same due allowance for perspective, the width 225 of the shorter ribbon 210 may be greater than the thickness 230 of the shorter ribbon 210. As can be seen in FIG. 10 the widths are a measurement of the buckling loop in a direction parallel to the axis of rotation 145. As shown in FIG. 10, the axis of rotation 145 is normal to the plane of the figure.

Although this invention has been described with a certain degree of particularity, it is to be understood that the present disclosure has been made only by way of illustration and that numerous changes in the details of construction and arrangement of parts may be resorted to without departing from the spirit and the scope of the invention.

The invention claimed is:

1. A buckling loop rotary motor, comprising:
    a rigid stator, comprising a cylindrical, inner surface having a circular cross-section;
    a buckling loop constrained within said cylindrical, inner surface to form one or more buckles;
    wherein, actuation, by a mechanical stress induced in said buckling loop, causes a change in curvature of one or more of said buckles that impels said buckling loop to rotate with respect to said rigid stator about an axis of rotation located coaxially with a central axis of said cylindrical, inner surface.

2. The rotary motor of claim 1, wherein, said buckling loop comprises a ribbon having a width greater than its thickness, said width being a measurement of said buckling loop in a direction parallel to said axis of rotation.

3. The rotary motor of claim 2, wherein, said buckling loop comprises a two-way shape memory active material, and the motor further comprises one or more heating elements.

4. The rotary motor of claim 2 wherein said buckling loop comprises a base band and an active band, and wherein said active band is comprised of a first, active material and said base band is comprised of a second, base material and wherein, in response to an actuating force, an activated portion of said first, active material expands in length by at least 0.1% more than said second material, thereby effecting a change of curvature of said actuated portion of said buckling loop.

5. The rotary motor of claim of claim 4, wherein, said buckling loop is a bi-metallic loop and said first, active material has a coefficient of linear, thermal expansion greater than said second, base material.

6. The rotary motor of claim of claim 5, wherein, said first, active material is one of a Titanium alloy, a stainless steel alloy, a copper alloy or an aluminum alloy, or a combination thereof.

7. The rotary motor of claim of claim 4, wherein said first, active material is an electroactive polymer (EAP) and said actuating force is supplied by an electrostatic charge.

8. The rotary motor of claim 7, wherein, said electrostatic charge is supplied to one or more regions of said buckling loop via one or more electrical contacts.

9. The rotary motor of claim 7, wherein, said electroactive polymer has a dielectric constant of at least 2 at room temperature and 1 KHz.

10. The rotary motor of claim 9, wherein, said electroactive polymer is one of an acrylic and a silicone, or a combination thereof.

11. The rotary motor of claim 4, wherein, said first, active material has an energy density greater than or equal to 0.02 J/cm$^3$.

12. The rotary motor of claim 11, wherein, said first, active material is one of an acrylic, a silicone, a piezoelectric, a shape memory alloy, a metal, and an electrochemomechanical conducting polymer, or some combination thereof.

13. The rotary motor of claim 4, wherein, said second, base material is a highly elastic material having a yield strain greater than 0.2%.

14. The rotary motor of claim 13, wherein, said second, base material is one of a fabric reinforced silicone, a fabric reinforced polyurethane, a Titanium alloy, a stainless steel alloy, a copper alloy or an aluminum alloy, or a combination thereof.

15. The rotary motor of claim 4, further comprising:
    a rotor, sized and shaped to conform, in part, to an inner surface of said buckling loop; and,
    one or more rollers rotatably attached to said rotor, and situated to contact said buckling loop at an inner surface of an apex of one or more of said buckles.

16. The rotary motor of claim 15, wherein, said first, active material comprises an electroactive material, and said rollers comprise one or more electrical contacts.

17. The rotary motor of claim 16, wherein, said buckling loop further comprises a staggered wiring array formed such that one or more contact points at an apex of one or more buckles activates said buckling loop at one or more inflection points of one of said buckles.

18. The rotary motor of claim of claim 2, further comprising:
    a rotor, sized and shaped to conform, in part, to an inner surface of said buckling loop; and,
    one or more heating elements located on said rotor adjacent to one or more inflection points of one of said buckles of said buckling loop.

19. The rotary motor of claim 18, wherein, said heating element is a light emitting diode (LED).

20. The rotary motor of claim 2 further comprising:
    a rotor, sized and shaped to conform, in part, to an inner surface of said buckling loop; and, one or more cooling element located on said rotor adjacent to one or more inflection points of one of said buckles of said buckling loop.

21. The rotary motor of claim 20, wherein, said cooling element is a Pelitier cooling device.

22. The rotary motor of claim 2, further comprising:
a rotor, sized and shaped to conform, in part, to an inner surface of said buckling loop; and,
at least one pair of a heating and a cooling element disposed on said rotor adjacent to a pair of inflection points of one of said buckles.

* * * * *